United States Patent [19]
Larsson et al.

[11] Patent Number: 5,777,914
[45] Date of Patent: Jul. 7, 1998

[54] TECHNIQUE FOR REDUCING POWER CONSUMPTION IN DIGITAL FILTERS

[75] Inventors: Patrik Larsson, Ocean; Christopher John Nicol, Red Bank, both of N.J.

[73] Assignee: Lucent Technologies Inc., Murray Hill, N.J.

[21] Appl. No.: 697,755

[22] Filed: Aug. 29, 1996

[51] Int. Cl.[6] .................................................. G06F 17/10
[52] U.S. Cl. ......................................................... 364/724.19
[58] Field of Search .......................... 364/724.19, 724.16, 364/760; 375/232

[56] References Cited

U.S. PATENT DOCUMENTS

| | | | |
|---|---|---|---|
| 5,146,494 | 9/1992 | Harman | 364/724.19 |
| 5,168,459 | 12/1992 | Hiller | 364/724.19 |
| 5,544,201 | 8/1996 | Hoshino et al. | 364/724.19 |

OTHER PUBLICATIONS

J. Ludwig et al., "Low-Power Digital Filtering Using Approximate Processing", *IEEE Journal of Solid-State Circuits*, vol. 31, No. 3, Mar. 1996, pp. 395–399.

M. Zheng et al., "Low Power and High Speed Multiplication Design through Mixed Number Representations", *IEEE ICCD*, 1995, pp. 566–570.

H. Choi et al., "Search–Based Wordlength Optimization for VLSI/DSP Synthesis", *IEEE*, 1994, pp. 198–207.

*Primary Examiner*—Tan V. Mai

[57] ABSTRACT

In a digital filter having tap coefficients, a gain element is employed to scale the filter output. The gain element is controlled by an error monitor element which runs an adaptive process in accordance with the invention. Such a process causes each tap coefficient value to be changed so as to reduce power consumption in the filter. On the other hand, the process ensures that the filter output maintains an acceptable signal to noise ratio (SNR), despite losing the bit precision of the filter as a result of the change of the coefficient values.

36 Claims, 4 Drawing Sheets

TECHNIQUE FOR REDUCING POWER CONSUMPTION IN DIGITAL FILTERS

FIELD OF THE INVENTION

The invention relates to a power saving technique for signal processing applications involving digital filters.

BACKGROUND OF THE INVENTION

Digital filters in the form of integrated circuit (IC) are commonly employed in signal processing applications. As the IC technology advances, the capacity of the digital filters is increased to provide, for example, additional programmability. The increase in the filter capacity invariably results in an increase in the power consumption of such filters. Filter power consumption is an important design issue especially where the power resources for the filters are limited. For instance, use of digital filters for signal processing is ubiquitous in portable devices, e.g., cellular phones. Such devices normally run on batteries which cannot afford high power consumption for a significant length of time.

The power consumption in a digital filter may also affect the choice of packaging for an IC device incorporating the filter. Power consumption and heat dissipation go hand in hand. The IC packaging becomes expensive if it is required to dissipate heat efficiently. Otherwise, poor heat dissipation would cause the lifetime of the filter to be substantially shortened.

Digital filters having so-called "Tap Coefficients" or "Filter Weights" are sometimes implemented in an adaptive manner in which the values of the filter weights are varied with time. FIG. 1A shows a block diagram of a general adaptive digital filter. As shown in FIG. 1A, filter 150 includes filter engine 160, the output of which constitutes the output (y) of the filter. With subtracter 151, an error (e) of the filter output is calculated by comparing the latter against the desired output (c). In response to the error level, update element 153 runs a standard training process to adjust the filter weights, represented by $W_1$ through $W_p$, at the inputs of respective IC multipliers 170 to minimize the error level, where p is the number of the multipliers.

IC multipliers 170 are traditional multipliers and contribute the most power consumption in the filter. The power consumption of the traditional multipliers is proportional to their size. One such multiplier is multiplier 100 shown in FIG. 1B. Multiplier 100, which is a conventional Booth encoded multiplier, takes in a pair of inputs, $W_j$ and $D_j$, each in the form of a vector comprising an array of binary bits, where $1 \leq j \leq p$. (It should be noted that, throughout this disclosure, a vector such as $W_j$ or $D_j$ is denoted by a symbol in a bold typeface.) Generically, $W_j = |w_1 w_2 \ldots w_n|$ and $D_j = |d_1 d_2 \ldots d_v|$, where n and v are positive integers. Input $D_j$ contains data bits, representing an external input to the multiplier, to be multiplied by $W_j$, representing an internal filter weight. The resulting product, denoted $W_j*D_j$, contributes to the output (y) of the filter represented by the following expression:

$$y = \sum_{j=1}^{p} W_j * D_j,$$

where "*" denotes a standard "multiply" operator.

As further shown in FIG. 1B, multiplier 100 includes product generating section 103 and Booth encoders 101-1 through 101-k which are structurally identical, where k is a positive integer. Section 103 further includes partial product generators 105-1 through 105-k, each of which is connected to a respective one of the encoders. In this particular prior art design, each Booth encoder receives three bits of $w_j$ and provides control bits for the associated partial product generator. The number of control bits depends on the particular logic implementation. In accordance with this prior art design, each Booth encoder generates three control bits denoted N, x1 and x2, respectively. We now refer to Table I as follows:

TABLE I

| $W_j$ Bits ($w_M w_I w_L$) | N | x1 | x2 | PPG Out |
|---|---|---|---|---|
| 000 | 0 | 0 | 0 | +0 |
| 001 | 0 | 1 | 0 | +$D_j$ |
| 010 | 0 | 1 | 0 | +$D_j$ |
| 011 | 0 | 0 | 1 | +2$D_j$ |
| 100 | 1 | 0 | 1 | −2$D_j$ |
| 101 | 1 | 1 | 0 | −$D_j$ |
| 110 | 1 | 1 | 0 | −$D_j$ |
| 111 | 1 | 0 | 0 | −0 | where "PPG Out" stands for the "partial product generator's output." As shown in Table I, in response to control bits x1 and x2, a partial product generator performs an operation of one times $D_j$, two times $D_j$, or zero times $D_j$. The latter operation results in a 0 vector representing a zero value or magnitude. In addition, the N bit controls the sign of the partial product generated by the generator. Specifically, an N bit having a bit value 0 causes the generator to generate a partial product having the same sign as $D_j$, and an N bit having a bit value 1 causes same to generate a partial product having an opposite sign to $D_j$. A negative partial product is represented by a two's complement of its positive counterpart. In a conventional manner, the individual outputs of partial product generators 105-1 through 105-k are summed using adders 109 to provide the product $W_j*D_j$.

SUMMARY OF THE INVENTION

In the prior art practice, a person skilled in the art utilizes the largest possible dynamic range of an internal filter weight (e.g. $W_j$) afforded by a filter to achieve a filter output having the highest signal-to-noise ratio (SNR). In direct contrast to such prior art practice, in accordance with the invention, the amplitude of each internal filter weight is minimized to reduce the power consumption in the filter and, at the same time, the error level of the filter output is controlled below a predetermined level.

To that end, a gain element is employed in the filter to scale the output thereof by a selected factor. In response to the scaled output, each of the filter weights is simultaneously changed by the same factor. Through an adaptive process, the value of the factor is selected based on the difference between the error level of the filter output and the predetermined level. Although the bit precision of the filter is changed in the process, the resulting signal-to-noise ratio (SNR) of the filter output is maintained at an acceptable level, in accordance with the invention. Advantageously, the power consumption in the inventive filter is substantially reduced.

BRIEF DESCRIPTION OF THE DRAWING

Throughout the disclosure, unless otherwise stated, like elements, components and sections in the figures are denoted by the same numerals.

DETAILED DESCRIPTION

Figure 1A:
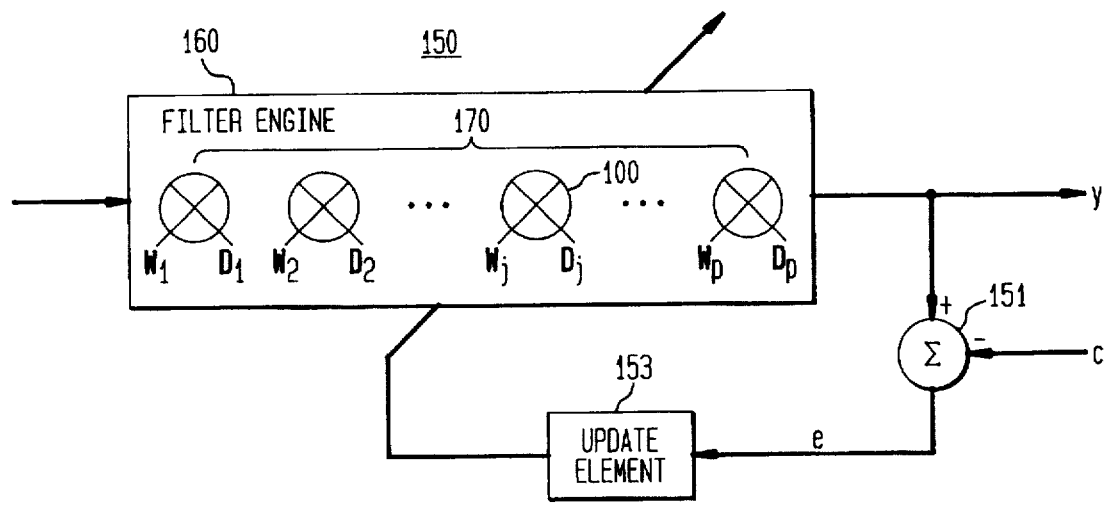
FIG. 1A is a block diagram of a general prior art adaptive digital filter.
Figure 1B:
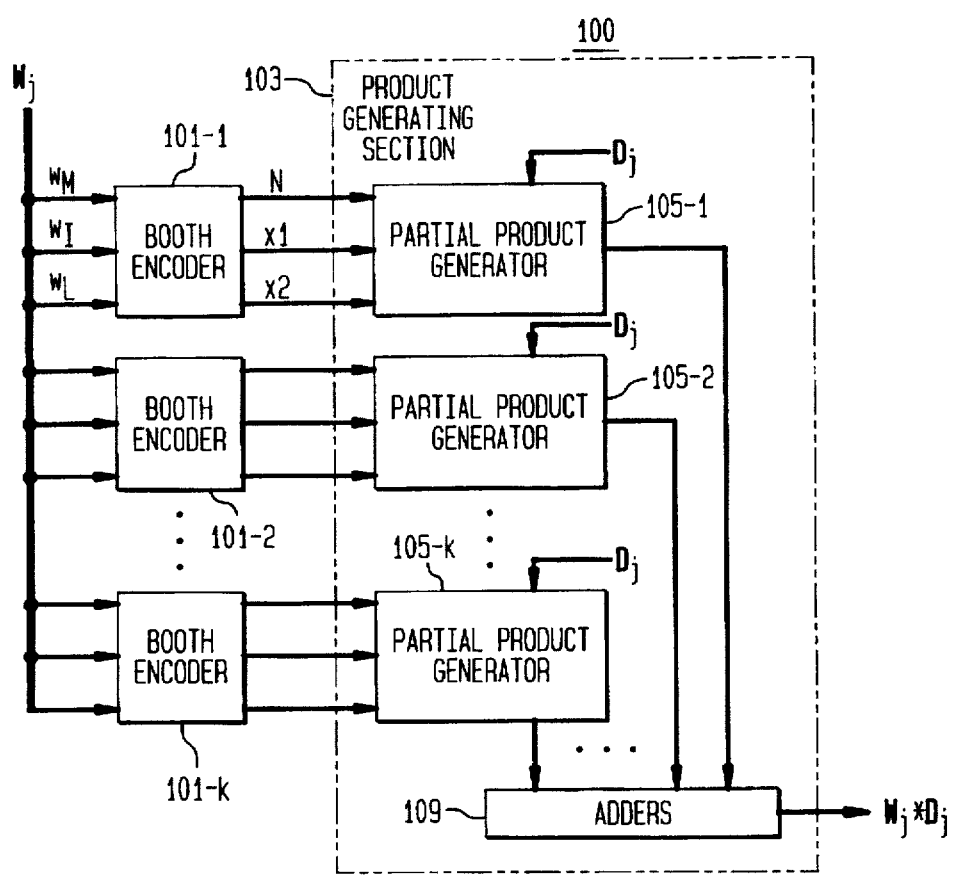
FIG. 1B is a block diagram of a traditional multiplier used in the filter of FIG. 1A.
Figure 2A:
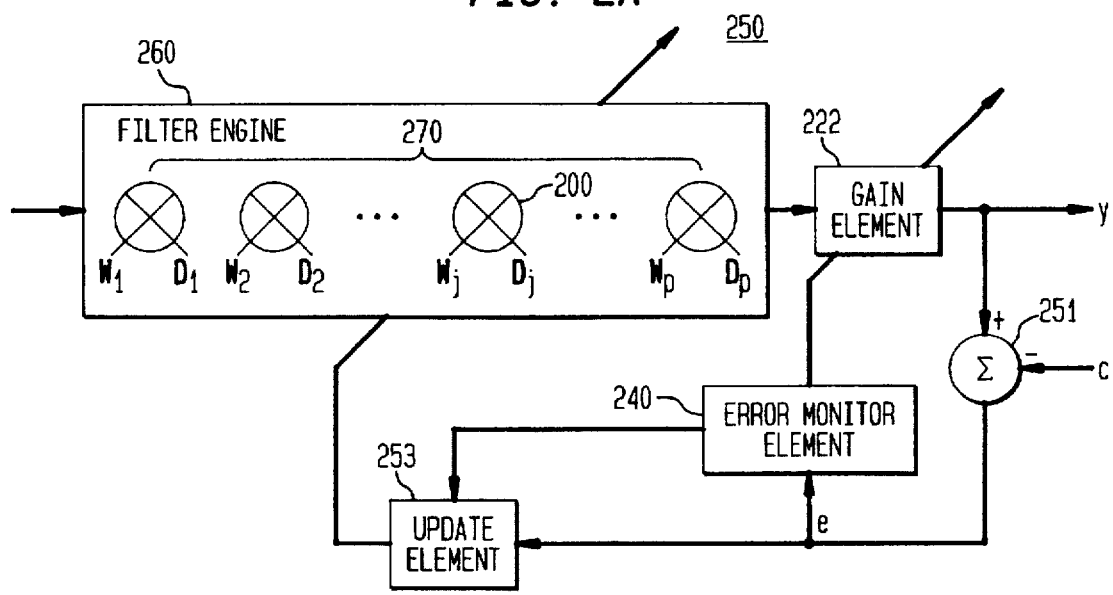
FIG. 2A is a block diagram of an adaptive digital filter in accordance with the invention.

FIG. 2A illustrates adaptive digital filter 250 embodying the principles of the invention. In this illustrative embodiment, digital filter 250 is an adaptive finite impulse response (FIR) filter having p tap coefficients or filter weights, denoted $W_1$ through $W_p$, where p is a positive integer.

Figure 2B:
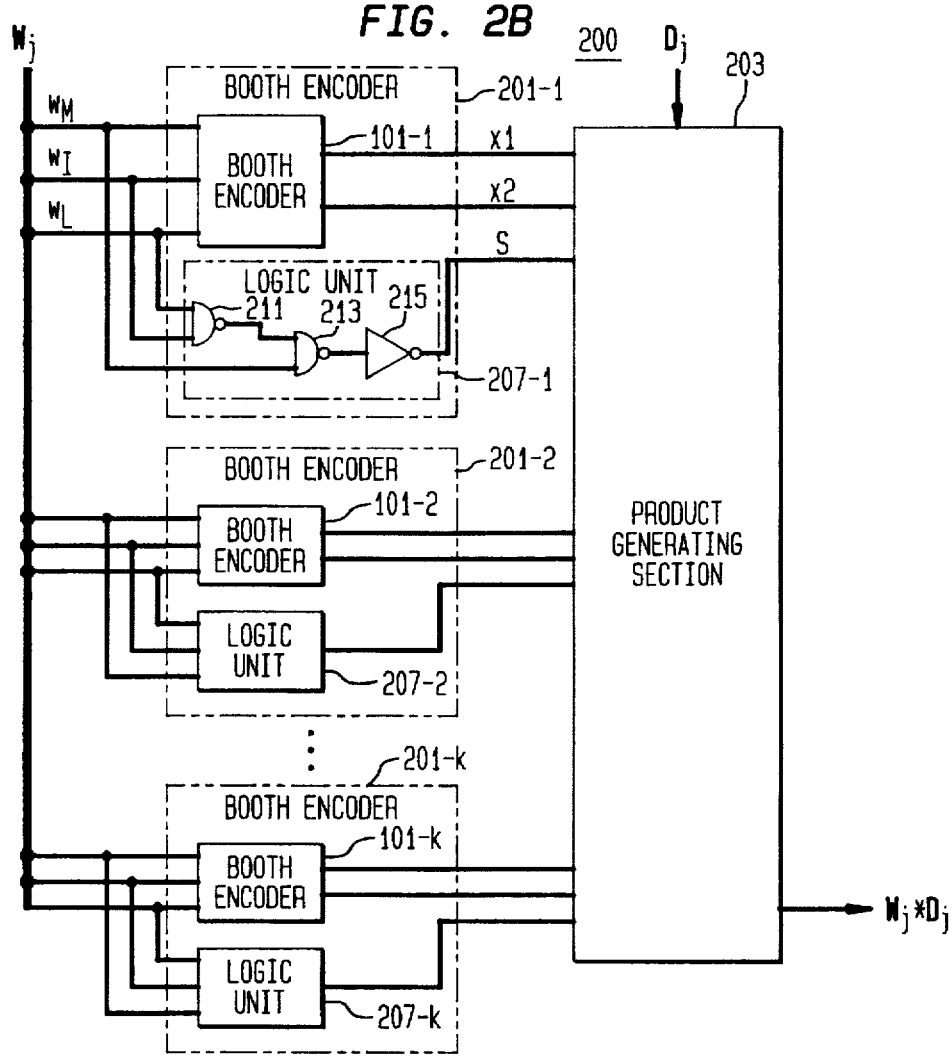
FIG. 2B is a block diagram of a multiplier used in the filter of FIG. 2A.

Central to filter 250 is filter engine 260 comprising p low-switching multipliers 270 which contribute the most power consumption in the filter. It should be noted that the inventive technique is generally applicable to filters having various implementations of the multipliers. By way of example, but not limitation, Booth encoded multiplier 200 working with 2's complement numbers illustrated in FIG. 2B is used in filter 250. In accordance with the invention, instead of utilizing the largest possible dynamic range of a filter weight afforded by a multiplier as in the prior art practice, the amplitude of the filter weight is minimized to reduce the power consumption by the multiplier. To that end, an adaptive scheme to be described is applied to scale the internal filter weights in filter 250 and, at the same time, to ensure that the error level of the filter output is better than acceptable.

Figure 3:
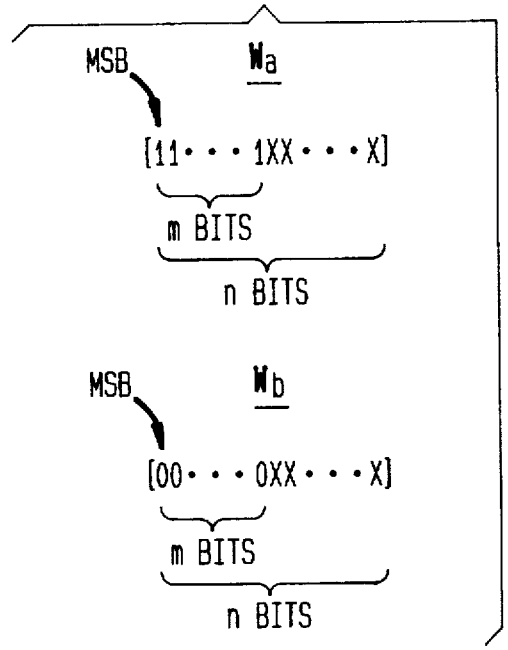
FIG. 3 illustrates examples of internal filter weights in the filter of FIG. 2A.

The inventive design of filter 250 will be more fully appreciated by first understanding the operation of multiplier 200 in the present application where the amplitude of each filter weight is relatively small with respect to its full dynamic range. The internal filter weight $W_j$ at an input of multiplier 200 typically looks like $W_a$ or $W_b$ in FIG. 3, where $1 \leq j \leq p$. In this example, although the full range for the internal weight is n bits long, because of the relatively small amplitude of the weight, only n-m bits (denoted by "X") in each of $W_a$ and $W_b$ are needed to represent the weight amplitude, where n>m and x=bit 1 or 0. The most significant bit (MSB) in each vector indicates the sign of the input value. Specifically, an MSB having a bit value 1 indicates a negative weight amplitude, and a bit value 0 indicates a positive weight amplitude. The remaining m-1 bits next to the MSB in each of $W_a$ and $W_b$ are redundant as they take the same bit value as the MSB of the vector. In filter 250, the value of m is often large as the amplitude of each internal weight is adjusted to be small, in accordance with the invention. That is, $W_j$ representing an internal weight in filter 250 has many identical high order bits (including the m-1 redundant bits), which are all 1's as in $W_a$ or all 0's as in $W_b$, depending on the sign of the weight amplitude.

Referring briefly back to Table I, in traditional multiplier 100, when identical $W_j$ bits (i.e., 111 or 000) are fed to a Booth encoder, it causes the associated partial product generator to output either a +0 or −0 vector. Although both of the +0 and −0 vectors represent a partial product having a zero magnitude, because of their different signs, the +0 vector comprises all bit 0's while the −0 vector is represented by its two's complement. That is, the −0 vector comprises all bit 1's, with another bit 1 as a carry input (not shown) to adders 109.

Thus, in a filter application where a filter weight input to a traditional multiplier (e.g., multiplier 100) contains many identical high order bits, they cause a significant number of partial products of either +0 (if the high order bits are all bit 0's) or −0 (if the high order bits are all bit 1's) to be generated in the multiplier. Furthermore, if weight values are applied to a multiplier in a time-multiplexed fashion, which is quite common, the consecutively applied weight values may switch between small positive and negative values. In response to such time-multiplexed filter weight inputs, the traditional multiplier generates a significant number of partial products of +0 and −0 in an alternate manner. However, each time when +0 is switched to −0, the bits in the previous partial product need to be changed from all 0's to all 1's. Similarly, each time when −0 is switched to +0, the bits in the previous partial product need to be changed from all 1's to all 0's. These switchings lead to high power consumption in the multiplier, and more so in a filter (e.g., filter 150) containing more than one such multiplier.

Referring back to FIG. 2B, multiplier 200 includes improved Booth encoders 201-1 through 201-k. Other than the Booth encoders, multiplier 200 is similar to multiplier 100. In fact, product generating section 203 in multiplier 200 is structurally identical to section 103 in multiplier 100 previously described.

Encoders 201-1 through 201-k incorporate Booth encoders 101-1 through 101-k, respectively. However, the use of control bit N generated by the latter is discontinued while the remaining control bits x1 and x2 remain employed. The control bit N is replaced by control bit S generated by logic units 207-1 through 207-k, which are structurally identical. For example, logic unit 207-1 includes logic "NAND" gates 211 and 213, and inverter 215 connected to one another in the manner as shown in FIG. 2B.

The relationship between the $W_j$ bits ($w_M$, $w_I$, $w_L$) and control bits S, x1 and x2, and the corresponding partial product generators' outputs in multiplier 200 are described in Table II as follows:

TABLE II

| $W_j$ bits ($w_M$ $w_I$ $w_L$) | S | x1 | x2 | PPG Out |
|---|---|---|---|---|
| 000 | 0 | 0 | 0 | +0 |
| 001 | 0 | 1 | 0 | +$D_j$ |
| 010 | 0 | 1 | 0 | +$D_j$ |
| 011 | 0 | 0 | 1 | +2$D_j$ |
| 100 | 1 | 0 | 1 | −2$D_j$ |
| 101 | 1 | 1 | 0 | −$D_j$ |
| 110 | 1 | 1 | 0 | −$D_j$ |
| 111 | 0 | 0 | 0 | +0 |

Table II is similar to Table I except for the last row of the table. Referring to the last row of Table II, in response to ($W_M$ $W_I$ $W_L$)=(1 1 1), each of logic units 207-1 through 207-k generates, in addition to x1=0 and x2=0, S=0, as opposed to N=1 in the traditional multiplier. In response to such control bits, a partial product generator accordingly generates +0 as the partial product output. Thus, according to the second row and last row of Table II, unlike multiplier 100, identical input $W_j$ bits at multiplier 200 always cause generation of the same partial product, which in this instance is +0.

Thus, in a filter application where time-multiplexed weight values applied to an improved multiplier (e.g. multiplier 200) alternate between small positive and negative values, the partial products having a zero magnitude occasioned by the identical high order bits of such filter weight inputs are always represented by +0 in the multiplier, regardless of the signs of the inputs. As a result, the redundant switching between +0 and −0 as in multiplier 100 is avoided, and a substantial amount of power consumption otherwise caused by such switching is obviated in the improved multiplier.

Figure 4:
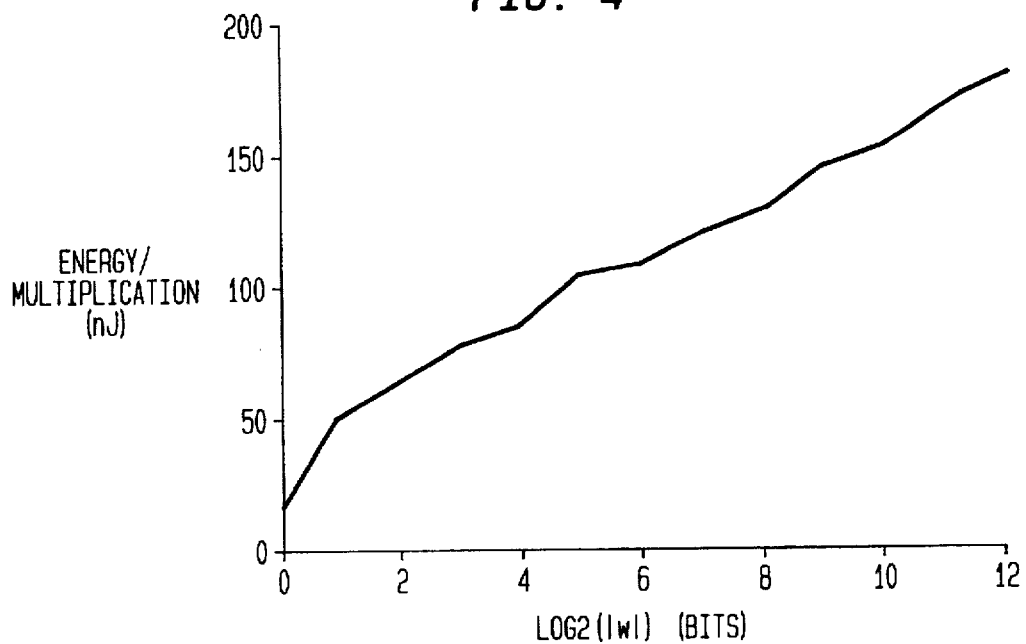
FIG. 4 is a graph showing an estimate of the power consumption in the multiplier of FIG. 2B as a function of the amplitude of a filter weight in a simulation.

FIG. 4 illustratively estimates the energy consumed per multiplication by multiplier 200 as a function of the amplitude of the weight input in an FIR filter module simulation. The simulated module contains four carry-save based multipliers of the type of multiplier 200, an adder and a number of registers. A 0.35 μm CMOS technology was used and clock buffers, source/drain diodes and estimates of parasitic capacitors were included. The non-zero power corresponding to $W_j=0$ (i.e., all weight bits equal 0) is attributed to the registers and the clock buffer. As shown in FIG. 4, the power consumption of multiplier 200 varies proportionally with the amplitude of the filter weight.

Figure 2C:
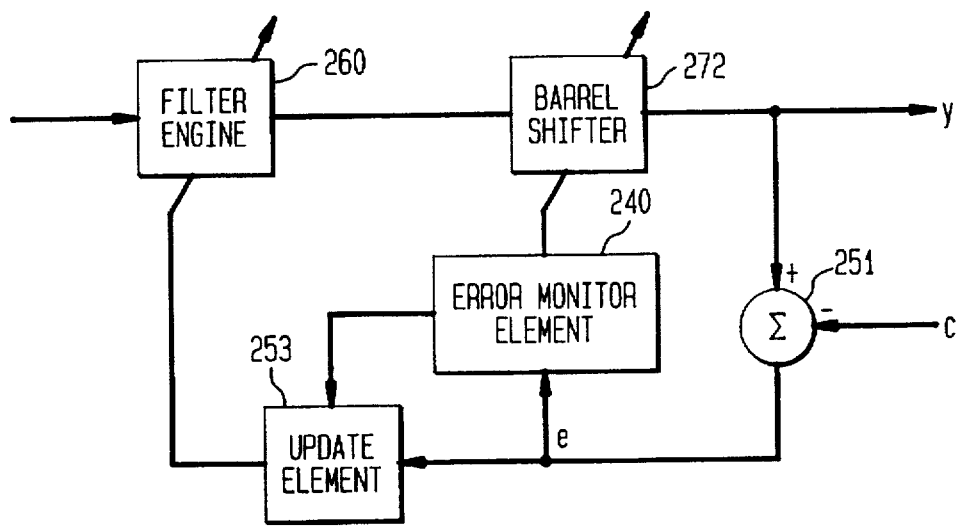
FIG. 2C illustrates the filter of FIG. 2A using a barrel shifter as a gain element therein.

Thus, in accordance with the invention, to minimize the power consumption in filter 250, the amplitude of each filter weight is scaled down as much as possible but high enough to achieve a filter output having an acceptable SNR. To this end, gain element 222 which may be a conventional multiplier is used to control the amplitude of the filter output. Element 222 provides a gain to the output of filter engine 260 by a factor A. Since filter 250 is an adaptive filter, and $$y = \sum_{j=1}^{p} W_j * D_j = A \sum_{j=1}^{p} \frac{1}{A} W_j * D_j,$$

in response to the gain of factor A injected by element 222, filter 250 adaptively adjusts its weights to $(1/A)W_j$, where j=1, 2, ... p, in order to maintain the output value (y). Thus, by increasing (or decreasing) the value of A at gain element 222, the filter weights are accordingly decreased (or increased). Specifically, error monitor element 240 controls the value of the gain factor A. By running the standard training process, update element 253, identical to update element 153, adjusts the filter weights with some delay after a change in the gain value. Alternatively, a faster way to adjust the filter weights is by restricting the gain factor A to be a power of two. In that instance, gain element 222 in FIG. 2A may be realized as a conventional barrel shifter, denoted 272 as shown in FIG. 2C. Each time when error monitor element 240, say, doubles the value A, it simultaneously causes a simple arithmetic shift of all the weights in filter 250 to halve the respective weight amplitudes.

Figure 5:
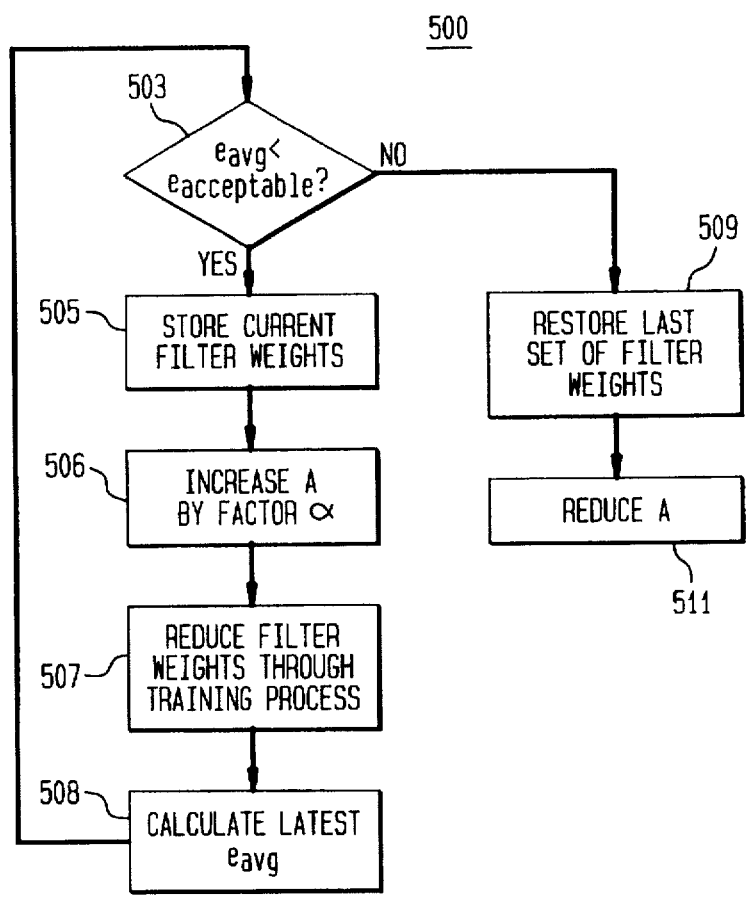
FIG. 5 is a flow chart depicting the steps of reducing the amplitudes of filter weights in the filter of FIG. 2A while maintaining the error level of the filter output below a predetermined level.

Referring to FIG. 5, in accordance with the invention, error monitor element 240 and update element 253 cooperatively run adaptive process 500 to ensure that the error level at the filter output is below a predetermined level, $e_{acceptable}$. Error monitor element 240 averages instantaneous errors (e) from subtracter 251, identical to subtracter 151. The average error, $e_{avg}$, is computed by element 240 based on absolute values of the instantaneous errors accumulated over a predetermined number of cycles. The gain value A of element 222 is initially set at unity. In accordance with process 500, error monitor element 240 first compares $e_{avg}$ with $e_{acceptable}$, as indicated at step 503. If $e_{avg} < e_{acceptable}$, error monitor element 240 at step 505 stores the current set of the filter weights. Element 240 then proceeds to step 506 where the value of A is increased by a factor α, where α is a real number greater than 1. In response to such an increase, update element 253 simultaneously reduces each of the filter weights in filter 250 through the standard training process, as indicated at step 507. (Optionally, the increase in A by a factor α may be followed by an immediate decrease in each of the filter weights by the same factor using a control process other than the training process.) As the filter weights are reduced, so is the filter power consumption, in accordance with the invention. While update element 253 is adjusting the weights through the training process in response to the new gain at element 222, element 240 calculates the latest $e_{avg}$, as indicated at step 508. If the training is successful, the new set of filter weights would then be reduced by a factor α with respect to the previous set. The filter weights are assumed to be converged when the differences in consecutive errors (e) are small during the training process. Process 500 then returns to step 503 where the current $e_{avg}$ is compared with $e_{acceptable}$. Steps 503, 505, 506, 507 and 508 are repeated until $e_{avg} \geq e_{acceptable}$. At that point, error monitor element 240 restores the last set of filter weights, as indicated at step 509, and at step 511 element 240 reduces the value of A to ensure $e_{avg} < e_{acceptable}$.

The foregoing merely illustrates the principles of the invention. It will thus be appreciated that those skilled in the art will be able to devise numerous other filter arrangements which embody the principles of the invention and are thus within its spirit and scope.

For example, although digital filter 250 as disclosed is an adaptive filter, the principles of the invention are generally applicable to a non-adaptive digital filter arrangement including one or more non-adaptive FIR filters. This arrangement may be implemented as an infinite impulse response (IIR) filter, or cascaded FIR filters. In such an arrangement, a gain element may be employed to scale the output of each non-adaptive FIR filter by a selected factor, in accordance with the invention. In response to the scaling of the filter output, the value of each of the weights in the non-adaptive filter is simultaneously changed by the same factor through a control process other than the standard training process as in an adaptive filter, thereby reducing power consumption in the filter arrangement.

Finally, although the disclosed digital filter is embodied in the form of various discrete electronic blocks and components, the invention could equally well be embodied in an arrangement in which the functions of any one or more of those blocks and components or indeed, all of the functions thereof, are realized, for example, by one or more appropriately programmed processors.

We claim:

1. A filter arrangement including at least one filter having a plurality of tap coefficients comprising:

a gain element for scaling an output of the filter by a selected factor;

an update element responsive to the scaling of said output for changing the value of each of said tap coefficients by said selected factor in a substantially simultaneous manner;

a feedback unit for determining an error level based on a comparison of the value of said output with a predetermined value; and a processor for determining the value of said selected factor based on at least the error level.

2. The filter arrangement of claim 1 wherein said at least one filter comprises a non-adaptive finite impulse response (FIR) filter.

3. The filter arrangement of claim 1 wherein said at least one filter comprises a plurality of non-adaptive FIR filters.

4. The filter arrangement of claim 1 wherein said processor determines the value of said selected factor based on a second comparison of said error level with a predetermined error level.

5. The filter arrangement of claim 4 wherein said predetermined error level represents an acceptable error level.

6. The filter arrangement of claim 1 wherein said predetermined value represents a value of a desired output of said filter.

7. The filter arrangement of claim 1 wherein the value of said selected factor is greater than one.

8. The filter arrangement of claim 1 wherein the value of said selected factor is a power of two.

9. The filter arrangement of claim 1 further comprising a plurality of multipliers for multiplying the values of said plurality of tap coefficients and the respective values of an ensemble of elements representing an input to said filter.

10. The filter arrangement of claim 9 wherein power consumption in each of said multipliers varies proportionally with an amplitude of a respective one of the tap coefficients provided to said multipliers.

11. A filter having a plurality of tap coefficients comprising:
an update element responsive to a change in a first error level of an output of said filter for varying the values of said plurality of tap coefficients, said first error level being a difference between the value of the output of said filter and a predetermined value;
means for selecting a gain factor based on a comparison of said first error level with a predetermined error level; and
means responsive to the selected gain factor for affecting said output, thereby changing said first error level, said update element varying in a substantially simultaneous manner the value of each of said plurality of tap coefficients by said selected gain factor in response to the change in said first error level.

12. The filter of claim 11 comprising an FIR filter.

13. The filter of claim 12 wherein said update element varies the value of each of said plurality of tap coefficients through a training process.

14. The filter of claim 11 wherein the affecting means includes a multiplier.

15. The filter of claim 11 wherein the affecting means includes a barrel shifter.

16. The filter of claim 11 wherein the value of said selected gain factor is a power of two.

17. The filter of claim 11 wherein the value of said selected gain factor is greater than one.

18. The filter of claim 11 further comprising a plurality of multipliers for multiplying the values of said plurality of tap coefficients and the respective values of an ensemble of elements representing an input to said filter.

19. The filter of claim 18 wherein said multipliers each operate in accordance with a Booth encoding algorithm.

20. The filter of claim 19 wherein said multipliers each include means for generating partial products, positive and negative partial products having a zero magnitude being represented by a selected vector.

21. The filter of claim 20 wherein said selected vector comprises all binary bits zero.

22. A method for use in a filter arrangement including a gain element and at least one filter having a plurality of tap coefficients, comprising the steps of:
scaling an output of the filter by a selected factor using said gain element;
changing, in response to the scaling of said output, the value of each of said tap coefficients by said selected factor in a substantially simultaneous manner;
determining an error level based on a comparison of the value of said output with a predetermined value; and
determining the value of said selected factor based on at least the error level.

23. The method of claim 22 wherein the value of said selected factor is determined based on a second comparison of said error level with a predetermined error level.

24. The method of claim 23 wherein said predetermined error level is an acceptable error level.

25. The method of claim 22 wherein said predetermined value is a value of a desired output of said filter.

26. The method of claim 22 wherein the value of said selected factor is greater than one.

27. The method of claim 22 wherein said selected factor is a power of two.

28. The method of claim 22 further comprising the step of multiplying said values of said plurality of tap coefficients and the respective values of an ensemble of elements representing an input to said filter.

29. A method for use in a filter having a plurality of tap coefficients comprising the steps of:
selecting a gain factor based on a comparison of a first error level with a second predetermined error level, said first error level being a difference between the value of an output of said filter and a predetermined value;
affecting said output of said filter in response to the selected gain factor, thereby changing said first error level; and
varying, in a substantially simultaneous manner, the value of each of said plurality of tap coefficients by said selected gain factor in response to the change in said first error level.

30. The method of claim 29 wherein the values of said plurality of tap coefficients are varied through a training process.

31. The method of claim 29 wherein the value of said selected gain factor is a power of two.

32. The method of claim 29 wherein the value of said selected gain factor is greater than one.

33. The method of claim 29 further comprising the step of multiplying said values of said plurality of tap coefficients and the respective values of an ensemble of elements representing an input to said filter.

34. The method of claim 33 wherein the multiplying step is performed in accordance with a Booth encoding algorithm.

35. The method of claim 34 wherein the multiplying step includes the step of generating partial products, positive and negative partial products having a zero magnitude being represented by a selected vector.

36. The method of claim 35 wherein said selected vector comprises all binary bits zero.

* * * * *